United States Patent
Van Antwerpen

(10) Patent No.: US 7,418,690 B1
(45) Date of Patent: Aug. 26, 2008

(54) LOCAL SEARCHING TECHNIQUES FOR TECHNOLOGY MAPPING

(75) Inventor: Babette Van Antwerpen, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 330 days.

(21) Appl. No.: 11/119,070

(22) Filed: Apr. 29, 2005

(51) Int. Cl.
*G06F 17/50* (2006.01)

(52) U.S. Cl. .......................................... 716/16; 716/2

(58) Field of Classification Search ............... 716/1–2, 716/16–18; 326/38–39
See application file for complete search history.

(56) References Cited

U.S. PATENT DOCUMENTS

| | | | | |
|---|---|---|---|---|
| 7,188,266 | B1 * | 3/2007 | Mendel et al. | 713/320 |
| 2004/0133869 | A1 * | 7/2004 | Sharma | 716/16 |
| 2005/0039157 | A1 * | 2/2005 | Sharma et al. | 716/18 |
| 2005/0156626 | A1 * | 7/2005 | Tomar et al. | 326/38 |

OTHER PUBLICATIONS

Hao Li: Low Power Technology Mapping and Performance Driven Placement for FPGAs, Nov. 9, 2004.*
Joey Y Lin: Placement Driven Technology mapping for LUT based FPGAs, ACM 2003.*
Julien Lamoureux and Steven Wilton: On the Interaction Between Power Aware FPGA CAD Algorithms, ACM 2003.*
Altera Patent Application "Timing Driven Synthesis with Area Trade Off", Filed with the U.S. Patent Office on May 18, 2004, assigned U.S. Appl. No. 10/849,534.
J. Cong, et al., "Simultaneous Depth and Area Minimization in LUT-Based FPGA Mapping" *Proceedings of the ACM Interantional Symposium on FPGAS*, (Feb. 1995) pp. 68-74.
Francis, R.J., et al., "Chortie-crf: Fast Technology Mapping for Lookup Table-Based FPGAs" *ACM/IEEE Design Automation Conference*, (Jun. 1991) pp. 613-619.
Kernighan, B.W., et al., "An Efficient Heuristic Procedure for Partitioning Graphs" *The Bell System Technical Journal*, (Sep. 30, 1969), vol. 49, No. 2, pp. 291-307.
Kirkpatric, S., et al., "Optimization by Simulated Annealing" *Science*, (May 13, 1983), vol. 220, No. 4598, pp. 671-680.
Aarts et al., *Local Search in Combination Optimization*, John Wiley & Sons Ltd., (1st edition, 1997).
Betz et al., *Architecture and CAD for Deep-Submicron FPGAs*, Kluwer Academic Publishers, 22-61 (1999).

* cited by examiner

*Primary Examiner*—Paul Dinh
(74) *Attorney, Agent, or Firm*—Townsend and Townsend and Crew LLP

(57) ABSTRACT

Local searches are provided for improving technology mapping for programmable logic integrated circuits. A local search algorithm is applied to a solution for mapping logic gates in a netlist to lookup tables (LUTs) on a programmable logic IC. The local search algorithm applies a series of local moves to the solution. At each move, a small change to the LUT mapping is proposed, and the change in cost for that LUT mapping change is computed. If the cost is improved, the change is accepted and the LUT mapping is replaced by the changed LUT mapping. Otherwise, the change in solution is either rejected, or accepted with a probability that depends on the cost change. The cost function can be chosen to represent one or more features of the LUT mapping, such as area, speed, power consumption, or a combination thereof.

20 Claims, 5 Drawing Sheets

Exhaustive Iterative Improvement

LOCAL SEARCHING TECHNIQUES FOR TECHNOLOGY MAPPING

BACKGROUND

The present invention relates to technology mapping techniques for programmable logic integrated circuits, and more particularly, to techniques for applying local searching to technology mapping.

Programmable logic integrated circuits typically include thousands of programmable logic elements that use logic gates and/or a lookup tables to perform logic operations. Programmable logic integrated circuits can also have a number of functional blocks adapted to perform specific logic operations. By configuring the combination of logic elements and functional blocks, a programmable logic integrated circuit (IC) can be adapted to perform virtually any type of information processing function.

A typical design cycle for determining the configuration of a programmable logic IC starts with an extraction phase, followed by a logic synthesis phase, and a placement and routing phase. The extraction phase produces a set of logic gates implementing the user design. A user design for a programmable IC is typically expressed as a netlist in a hardware description language such as verilog or VHDL.

In the logic synthesis phase, the set of logic gates is minimized and restructured, and then finally transformed into elements that correspond to portions of the programmable IC. The logic synthesis phase includes a technology mapping phase, during which simple logic gates in the netlist are replaced with lookup tables (LUTs) without changing the functionality of the netlist.

Typically, the technology mapping phase optimizes the netlist to minimize the usage of hardware in the programmable IC hardware (e.g., the number of logic elements or functional blocks). By minimizing the usage of programmable IC hardware, referred to generally as area, the user design can be implemented using the simplest and presumably least expensive programmable IC. However, minimizing the area of a user design tends to create data paths that pass through a large number of logic cells and/or functional blocks. This in turn increases the delay on data paths and decreases the maximum operating speed of the user design.

Alternatively, some technology mapping tools optimize strictly for maximum operating speed. Unfortunately, these methods substantially increase the area requirements for a user design. As a result, the cost to implement the speed-optimized user design also increases. Furthermore, many speed optimization techniques increase area so much that the performance improvements gained from using additional programmable IC hardware are negated by the additional routing delays introduced by the increased area of the design. Thus, the actual speed increase from these tools often falls short of theoretical projections.

A balanced technology mapping tool combines speed and area optimizations by initially using speed mapping to generate a mapping for a netlist, and then adjusting this mapping for the 10% of the logic gates that are on paths having the longest delays. The balanced mapping tool applies area mapping to the remaining 90% of the logic gates in the netlist.

It would however be desirable to provide more flexible techniques for technology mapping that improve the area and the speed of a user design.

BRIEF SUMMARY

The present invention applies local searches to technology mapping for programmable logic integrated circuits (ICs). According to the present invention, a local search algorithm is applied to a solution for mapping logic gates in a netlist to lookup tables (LUTs) on a programmable logic IC. The solution can be generated randomly or by a technology mapping tool.

The local search algorithm applies a series of local moves to the solution. At each move, a small change to the LUT mapping is proposed, and the change in cost for that LUT mapping change is computed. If the cost is improved, the change is accepted and the LUT mapping is replaced by the changed LUT mapping. Otherwise, the change in solution is either rejected, or accepted with a probability that depends on the cost change. The cost function can be chosen to represent one or more features of the LUT mapping, such as area, speed, power consumption, or a combination thereof.

Other objects, features, and advantages of the present invention will become apparent upon consideration of the following detailed description and the accompanying drawings, in which like reference designations represent like features throughout the figures.

DETAILED DESCRIPTION

According to the present invention, local search algorithms are applied to technology mapping for programmable logic integrated circuits. The present invention uses a local searching algorithm to improve upon a solution generated by a technology mapping tool or generated randomly. The local search algorithm makes local changes to the solution in an attempt to improve upon the solution relative to a predefined cost function. The local search algorithm uses a data structure to analyze and improve upon the solution. The data structure is based upon a netlist that represents the solution. The data structure contains a graph that has a node for each term (e.g., gate) in the netlist.

The local search algorithm uses cutsets for the nodes in the netlist. A cutset has a set of cuts. Each cut is a set of nodes in the graph that are part of a fanin cone for a selected output node N. The nodes in each cut are selected from different combinations of the input paths that feed into the selected output node N. The set of nodes in each cut is such that when the nodes from the fanin cone of a node N are removed, the fanin cone is separated into two parts, one part containing node N. The other part can be empty.

In a LUT mapping of the netlist, each gate that is implemented has a selected cut. A gate is implemented if either it is an input to a hard block, or it is an input to a selected cut of another gate that is implemented. The LUT mapping can be transformed into a netlist of LUTs by, for each implemented gate, replacing the logic gates in the netlist that are coupled between the input nodes of the selected cut and the gate itself with a LUT. The LUT performs the equivalent of the logic functions performed by the replaced logic gates. The inputs of a mapped LUT are coupled to the nodes in the cut, and the output of the mapped LUT is coupled to output node N.

A local search algorithm starts with a LUT mapping of the netlist and makes a sequence of moves on the netlist. A move is defined as selecting a different cut for an implemented gate. This may change which gates are implemented in the fanin cone of the gate under consideration. When a local search algorithm considers a move, it computes the difference in cost between the LUT mapping before the move and after the move. It can either accept or reject the given move depending on the difference in cost and the type of local search algorithm.

Figure 1:
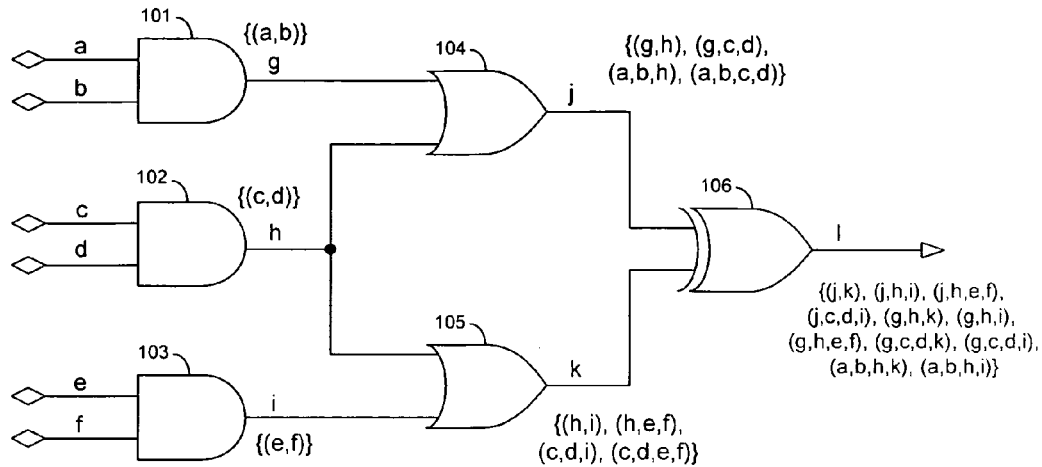
FIG. 1 illustrates lookup table mappings for a set of logic gates with cutsets according to an embodiment of the present invention.

FIG. 1 illustrates how a local search algorithm of the present invention can change which cuts are selected to be implemented for a network of logic gates. FIG. 1 illustrates a network of 6 logic gates including 3 AND gates 101-103, 2 OR gates 104-105, and 1 XOR gate 106. The input and output nodes of each gate in the network are labeled a-1. Each output node has a corresponding cutset shown in FIG. 1 in curly brackets { }.

For example, the output node of AND gate 101 has a cutset with one cut. The cut is (a,b), the two input nodes of gate 101. Thus, the selected cut for this gate will be the cut (a,b). When gate 101 is implemented in the final LUT mapping, this means the gate is replaced with a LUT that has nodes (a,b) as inputs and node g as an output.

As another example, XOR gate 106 has a cutset with 11 cuts within the network of FIG. 1 that can be mapped to a 4-input LUT. These cuts are (j,k), (j,h,i), (j,h,e,f), (j,c,d,i), (g,h,k), (g,h,i), (g,h,e,f), (g,c,d,k), (g,c,d,i), (a,b,h,k), and (a,b,h,i). A technology mapping or local search algorithm selects one of these cuts as the selected cut for this gate. When the algorithm is done, and gate 106 is implemented in the final LUT mapping, the gate is replaced with a LUT that has node 1 as an output and the nodes in the selected cuts as inputs.

A local search algorithm of the present invention analyzes the cost difference between a potential cut and the current selected cut for a gate (e.g., area, delay, power, etc.). If a LUT mapping having the potential cut is better than the LUT mapping in the original solution, the move is accepted, and the potential cut is chosen as the new selected cut for this gate. In general, the logic gates are not actually replaced by LUTs during the local search. When the local search algorithm is done, all the implemented gates are replaced by LUTs according to the cuts that were selected to improve the original solution. Some local search algorithms also accept some cuts that make the solution worse.

One embodiment of how a local search algorithm of the present invention can search through a netlist is now described. Each node in the netlist is marked with a flag, including simple gates and hard gates. The flag indicates whether or not the node is a LUT output. Hard gates include input and output pins, digital signal processing block, memory, and registers. Nodes that have to be the output of a lookup table (LUT) are also marked with a flag. A cutset is stored for each node. At any time during local search, each node has a cut selected, and thus there is a mapping solution.

To determine which nodes are the outputs of a LUT, the local search algorithm begins with the nodes that are always the output of a LUT (i.e., the nodes that feed hard gates). The inputs of the cuts selected for these nodes are also going to be outputs of a LUT. Recursively, all of the outputs of the LUTs can be determined using these assumptions.

According this embodiment, each move proceeds by selecting a node that has the flag set to a value indicating that the node is a LUT output. When a new cut is selected for a gate N, the algorithm recursively adjusts the flags of gates in the fanin cone of gate N. After that, the algorithm determines the cost change that results from changing the selected cut for gate N. Some types of local search algorithms accept the new cut only if the cost is better. Other types of local search algorithms accept the new cut if the cost is better or worse with a certain probability that depends on the cost and temperature (e.g., simulated annealing).

Any desired cost function can be used to evaluate LUT mappings using a local search algorithm of the present invention. A few examples are now described for illustration purposes, and are not intended to limit the scope of the present invention. For example, a cost function can cause a local search algorithm to improve the area of a design (usually less area is better), the delay of the design (usually less delay is better), the power consumption of a design (usually less power consumption is better), or any weighted combination thereof.

As a specific example, a cost function can cause a local search algorithm to preferably select LUT mappings that result in the least number of LUTs. Such a cost function is designed to minimize area in certain types of programmable ICs, such as the Stratix® I FPGA made by Altera Corporation of San Jose, Calif.

As another example, a cost function can cause a local search algorithm to preferably select LUT mappings that result in a combination of the least number of inputs and the least number of LUTs. This cost function can be implemented by giving each LUT a cost that depends on the number of inputs, such that a (k+1)-input LUT is more expensive than a k-input LUT, but two 2-input LUTs are still more expensive than one 6-input LUT. Some programmable ICs (such as Altera's Stratix® II) allow smaller LUTs to be combined together into one lookup table mask. In these programmable ICs, it is generally cheaper is terms of area savings to map gates to smaller LUTs rather than larger LUTs.

As yet another example, a cost function can cause a local search algorithm to preferably select LUT mappings that reduce the maximum LUT delay (i.e., depth) of any node that is a LUT output in the graph. This cost function provides a local search algorithm that optimizes speed in a user design.

A variation on the previous cost function also preferably selects LUT mappings that reduce the maximum delay through any path. This cost function calculates the delay of the longest path through each LUT output node, and takes the average over all LUT output nodes. The cost function causes the local search algorithm to select the LUT mapping that has the smallest average delay (i.e., depth).

As still another example, the delay cost function described above can cause a local search algorithm to average only K % of the nodes with the largest maximum LUT depth of any path through the node, for some value of K. This cost function, combined with a cost function that measures area, results in a balanced tradeoff between area and speed. Many other cost functions are possible, including any combination of the above described cost functions.

The present invention can include any type of local search algorithm applied to technology mapping for a programmable logic IC. Four examples of local search algorithms that can be used in the context of the present invention are now described with respect to FIGS. 2-5. The scope of the present invention is not limited to these four examples of local search algorithms. The present invention includes applying any type of local search algorithm to technology mapping, e.g. tabu search.

The first example of a local search algorithm that can be applied to technology mapping in the context of the present invention is referred to as iterative improvement. Iterative improvement begins with a solution (generated randomly or by a technology mapper) and applies local moves to the solution that strictly improve the cost of the solution relative to a selected cost function. The iterative improvement algorithm is finished when it can find no more cost-improving moves that can be made or when a specified maximum number of iterations is reached.

Iterative improvement algorithms are fast. However, an iterative improvement algorithm may get stuck in a local optimum. A local optimum is a solution that is better in cost than any solutions in its neighborhood, but is not as good as the optimal solution for the entire design.

Figure 2:
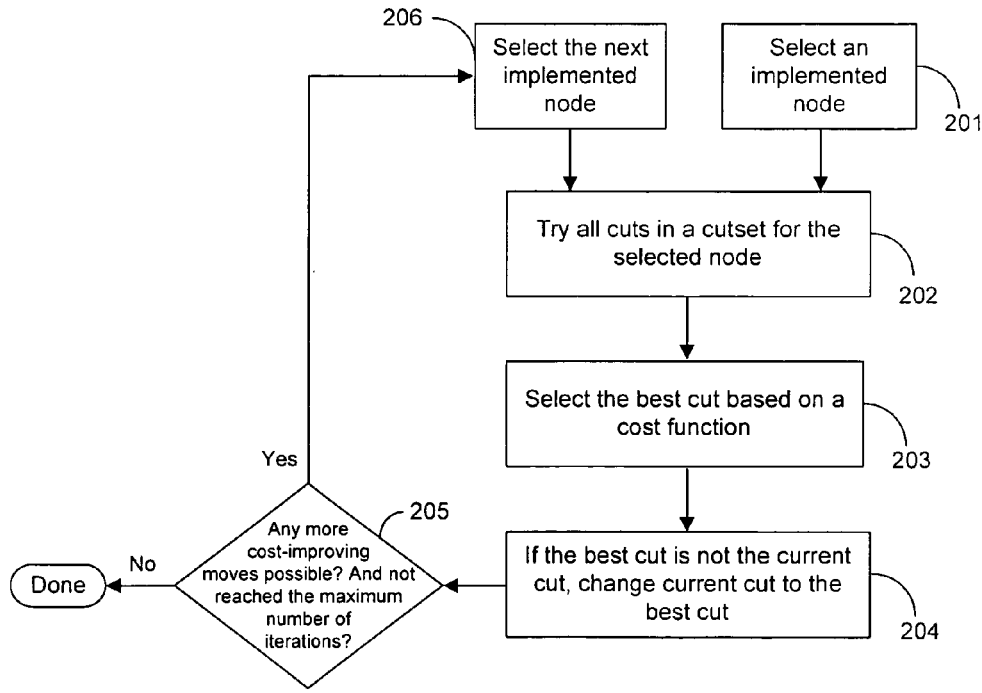
FIG. 2 illustrates an iterative improvement algorithm applied to technology mapping according to an embodiment of the present invention.

An embodiment of an iterative improvement algorithm that has been applied to technology mapping according to the present invention is shown in FIG. 2. The iterative improvement algorithm begins by selecting one of the nodes implemented in a netlist describing a user design at step 201. The initial solution can be generated by randomly mapping logic gates to LUTs in a user design or by a technology mapping tool.

At step 202, all of the cuts in the cutset for the selected node are compared with each other to determine which of the cuts generates the best LUT mapping based on parameters defined by a selected cost function. At step 203, the best cut is selected based on the cost function. If the best cut selected at step 203 is not the current cut in the solution, the current cut is changed to the best cut at step 204.

At decisional step 205, the stop criteria is analyzed. If there are more cost-improving moves possible, and the maximum number of iterations has not been reached, the local search continues. The next implemented node is selected at step 206, and the algorithm repeats. If all implemented nodes have been tried, the algorithm goes back to the first implemented node. The search terminates after the algorithm has tried to improve all nodes without success (or the maximum number of iterations is reached).

Figure 3:
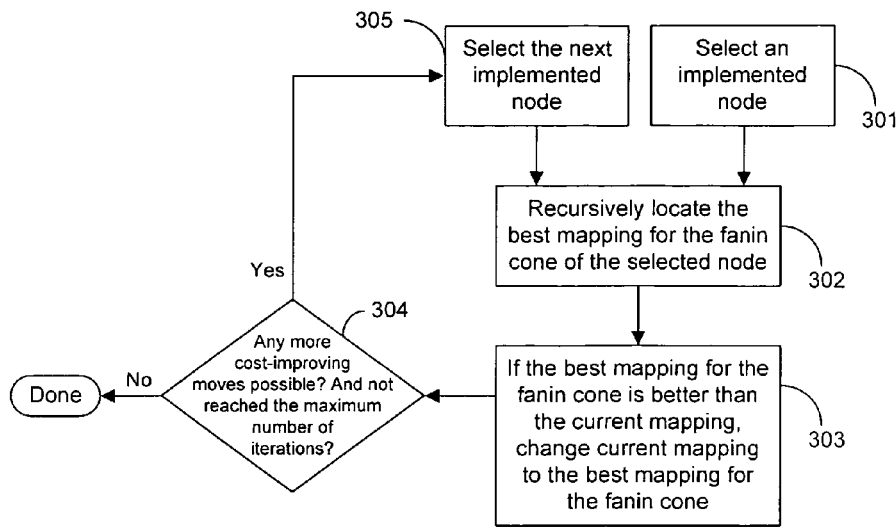
FIG. 3 illustrates an exhaustive iterative improvement algorithm applied to technology mapping according to an embodiment of the present invention.

A second example of a local search algorithm that can be applied to technology mapping in the context of the present invention is referred to as exhaustive iterative improvement. Exhaustive iterative improvement is a variation on iterative improvement. An embodiment of an exhaustive iterative improvement algorithm that has been applied to technology mapping according to the present invention is shown in FIG. 3.

The exhaustive iterative improvement algorithm begins by selecting one of the nodes implemented in a netlist describing a user design at step 301. As with the previous embodiment, the solution can be random or generated by a technology mapping tool. At step 302, the algorithm recursively locates the best LUT mapping for the fanin cone of the selected node. Exhaustive iterative improvement evaluates all combinations of better LUT mappings that were not previously selected as a LUT and determines which one is the best relative to a cost function. Any cost function can be used. Exhaustive iterative improvement can consider mappings within a fanin cone of the selected node that were not considered by iterative improvement.

Pruning can also be implemented at step 302. The exhaustive search for a better mapping in step 302 can be slow. To speed the search, it is possible to use pruning to stop the exhaustive search when that part of the search will probably not provide a better mapping. Pruning cannot be used with any cost function, but it can be used with the area cost function.

If the best mapping for the fanin cone is better than the current mapping in the solution, the current mapping is changed to the best mapping for the fanin cone at step 303. At decisional step 304, the stop criteria is analyzed. If there are more cost-improving moves possible, and the maximum number of iterations has not been reached, the local search continues. If the local search continues, the next node is selected at step 305, and the algorithm repeats. The search terminates after the algorithm has tried to improve all nodes without success (or the maximum number of iterations is reached).

A third example of a local search algorithm that can be applied to technology mapping in the context of the present invention is referred to as Lin-Kernighan. Lin-Kernighan is a variation on iterative improvement that tries to get out of locally optimal solutions. Instead of performing one move at a time, the Lin-Kernighan algorithm identifies a sequence of moves that, in total, improves the cost of a solution. A sequence of moves identified by Lin-Kernighan may contain individual moves that worsen the cost of the solution, as long as all of the moves in the sequence together improve the cost of the solution.

Figure 4:
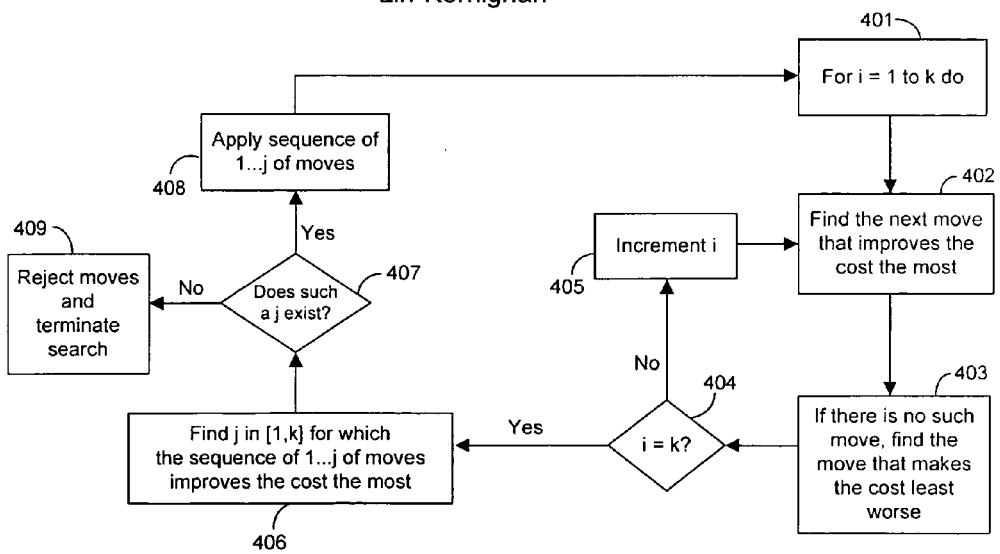
FIG. 4 illustrates a Lin-Kernighan algorithm applied to technology mapping according to an embodiment of the present invention.

An embodiment of a Lin-Kernighan algorithm that has been applied to technology mapping according to the present invention is shown in FIG. 4. The algorithm begins by starting a loop that allows a sequence of k moves at step 401, where k can be any whole number. Within the loop, a count variable i is incremented each time a move is performed. The loop continues until the count variable i equals k.

At step 402, the algorithm locates the move that improves the cost of the solution the most relative to a selected cost function. If there is no move that can be made that improves the cost, the move that worsens the cost of the solution the least is located at step 403. At step 404, a determination is made as to whether the count variable i=k. If i does not equal k, i is incremented at step 405, and steps 402-403 are repeated.

If i equals k, a value for j (where $1<=j<=k$) is found for which the sequence of 1 ... j of moves improves the cost of the solution the most (step 406). If such a j does not exist (step 407), the sequence of j moves are rejected and the search is terminated (step 409). If such a j does exist, the sequence of 1 ... j of moves is applied to the solution (step 408), and the process restarts at step 401.

A fourth example of a local search algorithm that can be applied to technology mapping in the context of the present invention is referred to as simulated annealing. Simulated annealing also tries to avoid getting stuck in a locally optimal solution. In a simulated annealing algorithm, a random move is selected in every step through a solution. When a move makes the cost of the solution better, the move is always accepted and applied to improve the solution. When a move makes the cost of the solution worse, the move is accepted with a certain probability. The probability is smaller if the cost of the solution is worse, and the probability decreases as the algorithm progresses. The algorithm stops when the temperature drops below a threshold, or no more moves have been accepted for a while.

Simulated annealing has the advantage that it can get to an optimal solution for any given solution, when moves are defined appropriately. Also, simulated annealing is easy to tune. The objective of the algorithm can be changed just by changing the cost function. The runtime of the algorithm can be adjusted by changing the cooling schedule. The cooling schedule is the speed with which the probability of accepting worse moves decreases. The cooling schedule also has an effect on how good the final solution will be. The slower that the probabilities go down, the better the final solution will be in general. One disadvantage of simulated annealing is that it can be slow in some applications.

Figure 5:
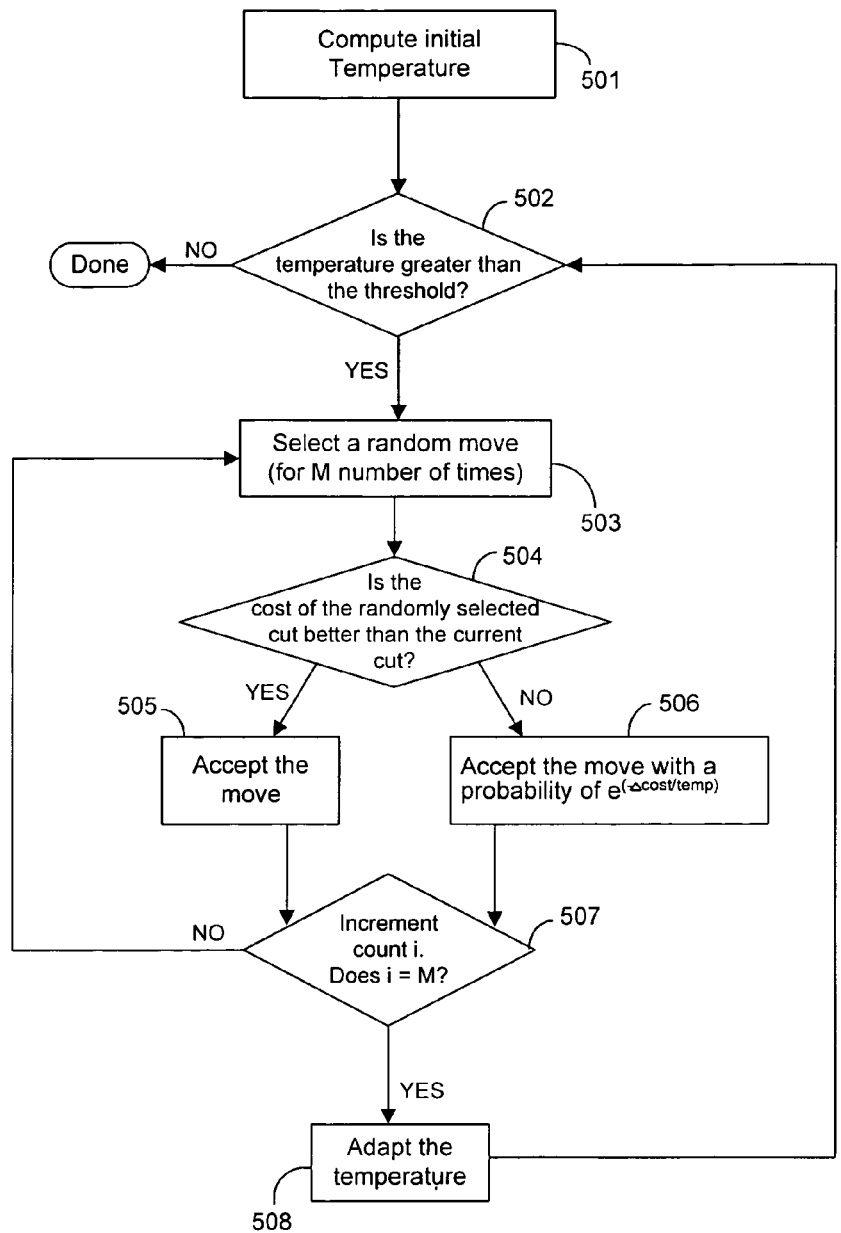
FIG. 5 illustrates a simulated annealing algorithm applied to technology mapping according to an embodiment of the present invention.

An embodiment of a simulated annealing algorithm that has been applied to technology mapping according to the present invention is shown in FIG. 5. The simulated annealing algorithm begins by computing an initial temperature at step 501. When a simulated annealing algorithm is applied to technology mapping in the context of the present invention, a temperature variable is used to determine a probability that a particular move will be accepted and applied to the solution.

After step 501, the simulated annealing algorithm enters a loop (e.g., a while . . . do loop). At decisional step 502, a determination is made as to whether the current temperature is greater than a predefined threshold value. If the temperature is not greater than the threshold, the algorithm terminates. If the temperature is greater than the threshold, a random move is selected at step 503.

M random moves are performed, where M can be any desired number. A random cut out of all the cutsets of nodes that are currently LUT outputs is selected. The cut belongs to a node, and the move consists of making the randomly selected cut the new cut selected for this node. At decisional step 504, the randomly selected cut is analyzed to determine whether the cost of that cut is better than the current cut in the solution.

If the cost of the new LUT mapping is not worse than the cost of the old LUT mapping, the move is accepted at step 505. If it is worse, than the move is only accepted with a certain probability at step 506. The probability determines the likelihood that the move will be applied to the solution.

For example, if the probability calculated at step 506 is only 15%, the move only has a 15% chance of being accepted to modify the original solution. The probability that a worse move is accepted equals $e^{(-\Delta cost/temp)}$, where the cost delta in the equation is the difference in cost between the solution with the move applied and the current solution, and the temperature (temp) variable equals the temperature calculated at step 501 (or step 508 for subsequent passes). In general, lower cost is more desirable.

At step 507, a counter variable i (initially set to 0) is incremented and then compared to M to determine if another pass through the loop should be made. If i is less than M, the loop continues by selecting another random move at step 503. If i equals M, the temperature is adapted at step 508 (e.g., decreased) based on the cooling schedule. As discussed above, the cooling schedule is the speed with which the probability of accepting worse moves decreases. The cooling schedule can be slowed down to generate a better final solution that more closely matches the cost function, or sped up to increase the speed of the simulated annealing algorithm.

After the temperature has been adapted at step 508, the new temperature is compared to the threshold at step 502. If the new temperature is less than or equal to the threshold, the simulated annealing algorithm terminates. If the new temperature is greater than the threshold, the loop starting at step 503 begins again by selecting a new random move. During subsequent passes through the loop, the temperature variable used in the equation at step 506 equals the new temperature calculated during the most recent pass through step 508.

The local search technology mapping techniques of the present invention can have many applications. For example, a local search can be used to evaluate the quality of an existing technology mapping algorithm. An existing technology mapping algorithm can be evaluated by performing simulated annealing with the same cost function as the algorithm to be evaluated. When the cooling schedule is slow enough, the simulated annealing algorithm will probably come up with a solution that is close to optimal for that cost function. This technique allows a user to determine how far from optimal the evaluated technology mapping algorithm is.

Local search algorithms can also allow experimentation with different cost functions. A cost function for a local search algorithm can be easily adjusted. Experiments can be run using a local search algorithm with different cost functions to determine which cost function provides the best tradeoff between speed and area.

Local search algorithms can also be used to obtain better technology mapping solutions. For example, iterative improvement can be applied to a solution generated by a technology mapping tool that optimizes area in order to improve the clock speed of the mapping. The iterative improvement algorithm can have a cost function that is a weighted sum of area, average maximum LUT depth of all LUT output nodes, and the average maximum LUT depth of the k % LUT output nodes with the highest LUT depth. The weights given to the various factors used in the cost function can be varied to obtain optimal results. Also, the k % percentage of the most depth-critical gates can be varied to obtain optimal results.

One challenge involved in applying local search to existing technology mapping solutions is getting the local search algorithm to run fast enough. Simulated annealing, for example, may be unacceptably slow. However, the cooling schedule can be adapted to speed up the run time.

Local search algorithms can also be used as research tools for programmable logic ICs having LUT-based architectures. For example, simulated annealing can be used to quickly create a prototype technology mapping algorithm for a potential new architecture. A user can play with the cost function of the local search to get different types of mappings. Using local search as a research tool can help in evaluating different implementations for the architecture.

Figure 6:
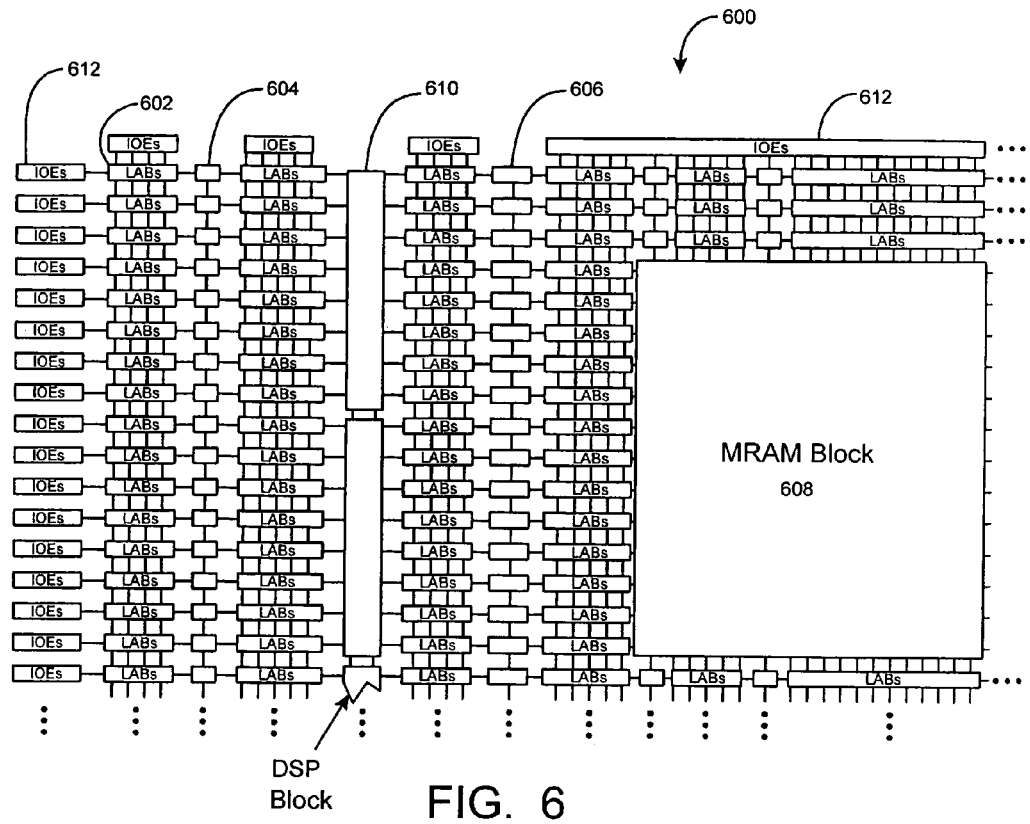
FIG. 6 is a simplified block diagram of a programmable logic device that can benefit from the techniques of the present invention.

FIG. 6 is a simplified partial block diagram of one example of a programmable logic device PLD 600. The local search technology mapping techniques of the present invention can be applied to various programmable logic ICs such as PLD 600. The present invention can apply to numerous types of PLDs, field programmable gates arrays (FPGAs), and other types of programmable logic integrated circuits.

PLD 600 includes a two-dimensional array of programmable logic array blocks (or LABs) 602 that are interconnected by a network of column and row interconnects of varying length and speed. LABs 602 include multiple (e.g., 10) logic elements (or LEs).

An LE is a programmable logic block that provides for efficient implementation of user defined logic functions. A PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 600 also includes a distributed memory structure including RAM blocks of varying sizes provided throughout the array. The RAM blocks include, for example, 512 bit blocks 604, 4K blocks 606, and a block 608 providing 512K bits of RAM. These memory blocks can also include shift registers and FIFO buffers.

PLD 600 further includes digital signal processing (DSP) blocks 610 that can implement, for example, multipliers with add or subtract features. I/O elements (IOEs) 612 located, in this example, around the periphery of the device support numerous single-ended and differential I/O standards. It is to be understood that PLD 600 is described herein for illustrative purposes only and that the present invention can be implemented in many different types of PLDs, FPGAs, and the like.

Figure 7:
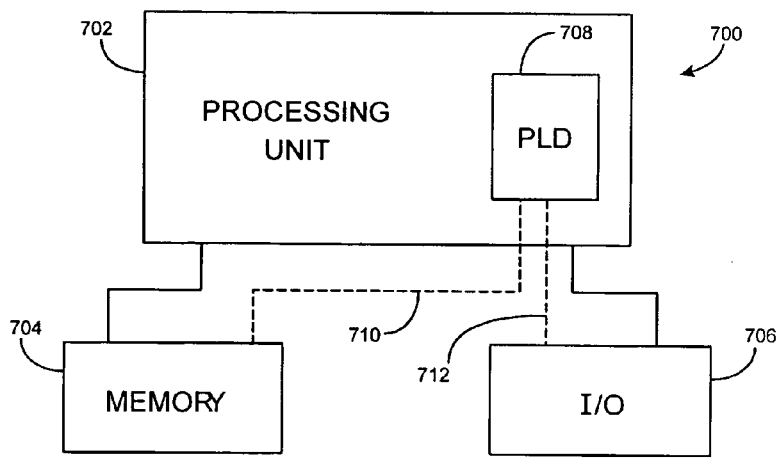
FIG. 7 is a block diagram of an electronic system that can benefit from embodiments of the present invention.

While PLDs of the type shown in FIG. 6 provide many of the resources required to implement system level solutions, the present invention can also benefit systems wherein a PLD is one of several components. FIG. 7 shows a block diagram of an exemplary digital system 700. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704 and an I/O unit 706 interconnected together by one or more buses. According to this exemplary embodiment, a programmable logic device (PLD) 708 is embedded in processing unit 702. PLD 708 can serve many different purposes within the system in FIG. 7. PLD 708 can, for example, be a logical building block of processing unit 702, supporting its internal and external operations. PLD 708 is programmed to implement the logical functions necessary to carry on its particular role in system operation. PLD 708 can be specially coupled to memory 704 through connection 710 and to I/O unit 706 through connection 712.

Processing unit 702 can direct data to an appropriate system component for processing or storage, execute a program stored in memory 704 or receive and transmit data via I/O unit 706, or other similar function. Processing unit 702 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 708 can control the logical operations of the system. In an embodiment, PLD 708 acts as a reconfigurable processor, which can be reprogrammed as needed to handle a particular computing task. Alternately, programmable logic device 708 can itself include an embedded microprocessor. Memory unit 704 can be a random access memory (RAM), read only memory (ROM), fixed or flexible disk media, PC Card flash disk memory, tape, or any other storage means, or any combination of these storage means.

Figure 8:
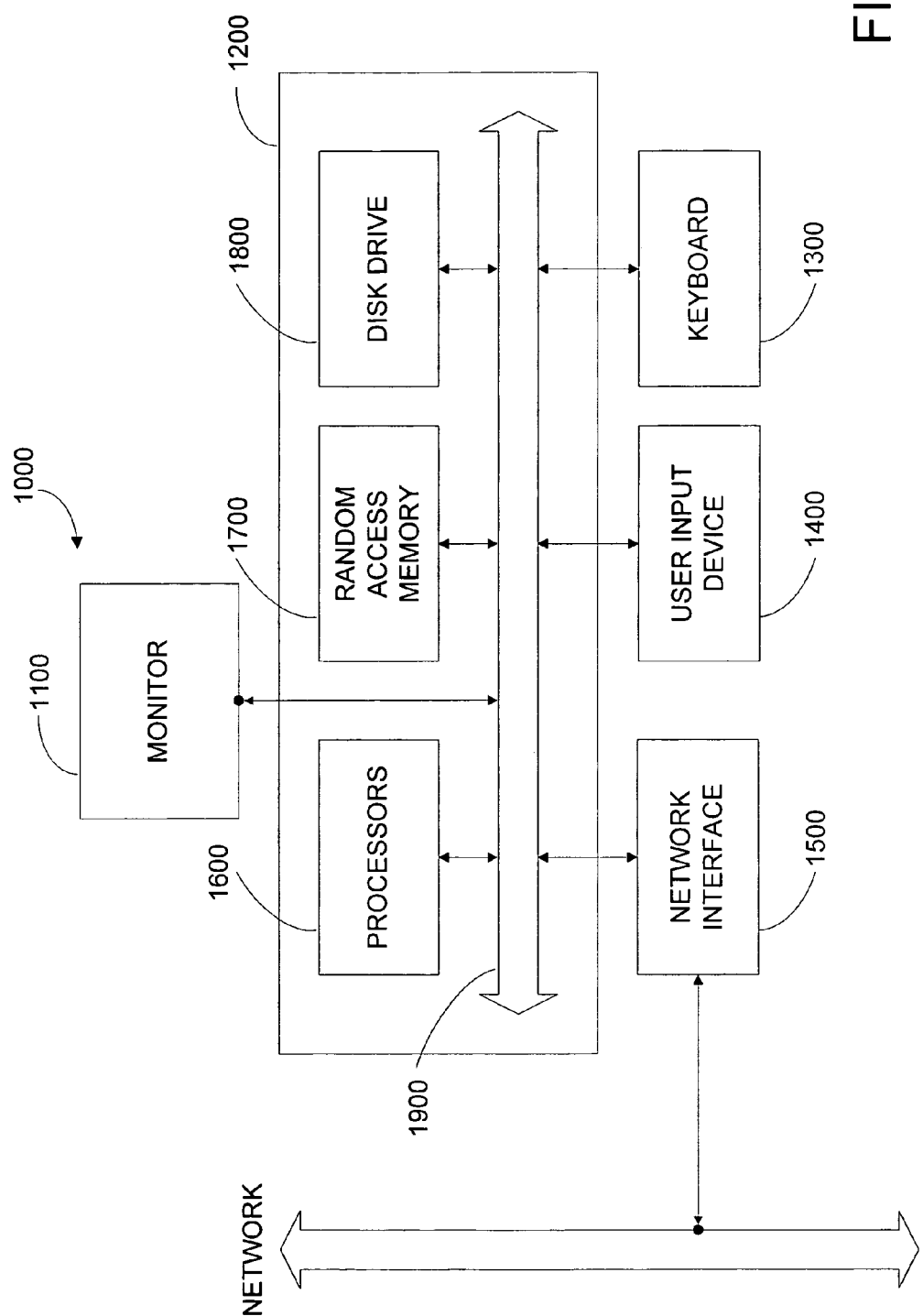
FIG. 8 illustrates an example computing system suitable for use with embodiments of the present invention.

FIG. 8 illustrates an example computer system 1000 capable of implementing embodiments of the present invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, and embodiments of the herein described invention.

Further embodiments of computer 1200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A method for applying a local search to technology mapping to generate a solution with an improved cost function the method comprising:

receiving a solution for mapping logic gates in a netlist to lookup tables (LUTs), wherein the netlist describes a design for a programmable logic integrated circuit (IC); and making a series of local moves to the solution wherein each of the local moves corresponds to changing a LUT mapping for at least one of the logic gates in the netlist, wherein the local search is exhaustive iterative improvement, and wherein making the series of local moves to the solution further comprises:

for each of the local moves, recursively locating a best LUT mapping for a fanin cone of a node relative to a cost function.

2. The method defined in claim 1 wherein the cost function is a weighted sum that is based on area, delay, and power.

3. The method defined in claim 2 wherein the delay in the cost function is based at least in part on an average maximum LUT depth of all LUT output nodes.

4. The method defined in claim 1 wherein the local search is applied to a solution generated by a technology mapping tool that optimizes area, and wherein the local search has a cost function that is a weighted sum of area, an average maximum LUT depth of all LUT output nodes, and an average maximum LUT depth of a k % LUT output nodes with a highest LUT depth.

5. The method defined in claim 1 further comprising:
replacing original LUT mappings in the solution with one of the selected LUT mappings when the selected LUT mapping improves a cost of the solution relative to the cost function more than the corresponding original LUT mapping.

6. The method defined in claim 1 wherein the local search is used to evaluate a quality of an existing technology mapping algorithm by using a simulated annealing method and a cost function used in the existing technology mapping algorithm, and running an experiment on multiple circuits to compare a quality of a mapping from the existing technology mapping algorithm with a mapping from the simulated annealing method.

7. The method defined in claim 1 wherein experiments are run using the local search with different cost functions to determine which of the different cost functions provides a desired tradeoff between speed, area and power.

8. The method defined in claim 1 wherein the local search is used as a research tool to evaluate different implementations for a potential new architecture for the programmable logic IC.

9. A method for applying a local search to technology mapping to generate a solution with an improved cost function, the method comprising:
receiving a solution for mapping logic gates in a netlist to lookup tables (LUTs), wherein the netlist describes a design for a programmable logic integrated circuit (IC); and
making a series of local moves to the solution wherein each of the local moves corresponds to changing a LUT mapping for at least one of the logic gates in the netlist,
wherein making the series of local moves to the solution further comprises selecting a sequence of local moves in the solution using a Lin-Kernighan algorithm, wherein each of the local moves in the sequence is selected based on which local move improves a cost of the solution most or worsens the cost of the solution least relative to a cost function.

10. The method defined in claim 9 wherein the cost function is a weighted sum that is based on area, delay, and power.

11. The method defined in claim 10 wherein the delay in the cost function is based at least in part on an average maximum LUT depth of all LUT output nodes.

12. The method defined in claim 9 wherein the local search is applied to a solution generated by a technology mapping tool that optimizes area, and wherein the local search has a cost function that is a weighted sum of area, an average maximum LUT depth of all LUT output nodes, and an average maximum LUT depth of a k % LUT output nodes with a highest LUT depth.

13. The method defined in claim 9 further comprising:
replacing original LUT mappings in the solution with one of the selected LUT mappings when the selected LUT mapping improves a cost of the solution relative to the cost function more than the corresponding original LUT mapping.

14. The method defined in claim 9 wherein the local search is used to evaluate a quality of an existing technology mapping algorithm by using a simulated annealing method and a cost function used in the existing technology mapping algorithm, and running an experiment on multiple circuits to compare a quality of a mapping from the existing technology mapping algorithm with a mapping from the simulated annealing method.

15. The method defined in claim 9 wherein experiments are run using the local search with different cost functions to determine which of the different cost functions provides a desired tradeoff between speed, area and power.

16. The method defined in claim 9 wherein the local search is used as a research tool to evaluate different implementations for a potential new architecture for the programmable logic IC.

17. A computer system for applying a local search to technology mapping for a programmable logic integrated circuit (IC) the computer system comprising:
code for receiving a solution that maps logic gates in a netlist to lookup tables (LUTs), wherein the netlist describes a design for the programmable logic IC; and
code for making a series of local moves to the solution, wherein each of the local moves corresponds to changing a LUT mapping for at least one of the logic gates in the netlist,
wherein the local search is exhaustive iterative improvement, and wherein the code for making the series of local moves to the solution further comprises:
code for recursively locating a best LUT mapping for a fanin cone of a node relative to a cost function for each of the local moves.

18. The computer system defined in claim 17 further comprising:
code for replacing original LUT mappings in the solution with new LUT mappings corresponding to selected cuts.

19. A computer system for applying a local search to technology mapping for a programmable logic integrated circuit (IC), the computer system comprising:
code for receiving a solution that maps logic gates in a netlist to lookup tables (LUTs), wherein the netlist describes a design for the programmable logic IC; and
code for making a series of local moves to the solution, wherein each of the local moves corresponds to changing a LUT mapping for at least one of the logic gates in the netlist,
wherein the code for making the series of local moves to the solution further comprises code for selecting a sequence of local moves in the solution using a Lin-Kernighan algorithm, wherein each of the local moves in the sequence is selected based on which local move improves a cost of the solution most or worsens the cost of the solution least relative to a cost function.

20. The computer system defined in claim 19 further comprising:
code for replacing original LUT mappings in the solution with new LUT mappings corresponding to selected cuts.

* * * * *